United States Patent
Chan et al.

(10) Patent No.: US 7,228,514 B2
(45) Date of Patent: Jun. 5, 2007

(54) METHOD, SYSTEM AND COMPUTER PROGRAM PRODUCT FOR AUTOMATICALLY ESTIMATING PIN LOCATIONS AND INTERCONNECT PARASITICS OF A CIRCUIT LAYOUT

(75) Inventors: Yiu-Hing Chan, Poughkeepsie, NY (US); Jonathan M. Chu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 213 days.

(21) Appl. No.: 11/040,139

(22) Filed: Jan. 21, 2005

(65) Prior Publication Data

US 2006/0190900 A1 Aug. 24, 2006

(51) Int. Cl.
*G06F 17/50* (2006.01)
(52) U.S. Cl. .............................................. 716/5; 716/4
(58) Field of Classification Search ................. 716/4–6
See application file for complete search history.

(56) References Cited

U.S. PATENT DOCUMENTS 6,080,201 A * 6/2000 Hojat et al. ................... 703/14
6,523,156 B2 * 2/2003 Cirit ............................... 716/9
6,804,810 B1 * 10/2004 Petersen et al. .............. 716/12
7,082,587 B2 * 7/2006 Chen et al. ..................... 716/6
2002/0029371 A1 * 3/2002 Hwang et al. ................ 716/10

* cited by examiner

*Primary Examiner*—Jack Chiang
*Assistant Examiner*—Binh Tat
(74) *Attorney, Agent, or Firm*—Lynn L. Augspurger, Esq.; Kevin P. Radigan, Esq.; Heslin Rothenburg Farley & Mesiti, P.C.

(57) ABSTRACT

A circuit design technique is provided for automatically estimating lengths of interconnect segments to be employed in interconnecting at least some circuit components of a plurality of placed circuit components of a circuit layout. The automatically estimating includes automatically generating pin locations for a plurality of pins in at least one level of the hierarchy to be employed with the at least some circuit components of the circuit layout, wherein the interconnect segments interconnect the plurality of pins. A route estimator is employed to estimate lengths of the interconnect segments based on the pin locations of the plurality of pins. The estimated interconnect segment lengths are then employed in automatically estimating resistance capacitance interconnect parasitics for the interconnect segments to be employed in the circuit layout.

22 Claims, 8 Drawing Sheets

```
3 PINS FOR NET "SEG 1"
(PIN#   X-COORDINATE   Y-COORDINATE)
   1         2              6       //PIN 1  X=2, Y=6
   2         2              3       //PIN 2  X=2, Y=3
   3         3              5       //PIN 3  X=3, Y=5

PLOT PINS AND CREATE THE STEINER GRAPH
FsO:  1 2 3    //CONNECTING PINS 1,2 AND 3
1P    2 5      //DRAW A SEGMENT FROM PIN 1 TO A POINT AT X=2, Y=5
2P    2 5      //DRAW A SEGMENT FROM PIN 2 TO A POINT AT X=2, Y=5
3P    2 5      //DRAW A SEGMENT FROM PIN 3 TO A POINT AT X=2, Y=5
```

METHOD, SYSTEM AND COMPUTER PROGRAM PRODUCT FOR AUTOMATICALLY ESTIMATING PIN LOCATIONS AND INTERCONNECT PARASITICS OF A CIRCUIT LAYOUT

TECHNICAL FIELD

This invention relates in general to VLSI circuit design, and more particularly, to an automated technique for estimating pin locations and lengths of interconnect segments to be employed in interconnecting at least some circuit components of a plurality of placed circuit components of a circuit layout, and for employing the estimated pin locations and interconnect segment lengths in estimating resistance capacitance interconnect parasitics for the circuit layout.

BACKGROUND OF THE INVENTION

In a large scale VLSI circuit design project, an initial step is to create a description of chip functionality. This description is created in Register Transfer Language ("RTL"). One of the considerations in a circuit design is to optimize the resistance capacitance (RC) values of the configuration, while minimizing the negative effects that the RC values may have on timing. Connection paths for signals between different components of a VLSI circuit have inherent RC values that may cause delays in propagation. These values are referred to herein as RC interconnect parasitics.

According to known design techniques, RC parasitic values have been either ignored completely or approximated by considering only a capacitance component at the initial design stage of a VLSI design project. This was acceptable because RC parasitic delays were typically low compared with gate delays. According to this method, the resistive component was disregarded at the initial layout stage, with the total line capacitance being lumped together. In the past, this produced a fair estimation.

Another design method is to manually place RC values representative of the RC interconnect parasitics into the schematics. This involves roughly planning out where various blocks are to be placed, then manually measuring or estimating the length of a wire of interest based on a drawn floorplan of the design. In this way, resistance and capacitance parasitics may be manually annotated onto the schematic. The schematic with the estimated interconnect and via parasitic elements would then be analyzed through timing tools for timing and area optimization. This process requires significant manual effort on the part of the designer in measuring and estimating the wire lengths between circuit components in the design, and then annotating the schematic with these parasitic electrical elements. The accuracy and completeness of the estimated wire lengths between circuit components depends on the experience of the designer, and can vary significantly within a large VLSI circuit design team. Using this approach, the timing of the design will not be known with a high degree of confidence until the layout is completely routed and extracted timing is performed. This manually intensive process further makes it difficult to consider the RC parasitic values as components are moved or different configurations are explored, since the parasitic values would need to be recalculated. Another drawback to this design method is that the design effort is relatively far along before RC parasitic delays are considered, making it difficult to revise a design to overcome a negative impact of such RC parasitic delays. The present invention provides techniques for addressing these drawbacks of the prior approaches.

SUMMARY OF THE INVENTION

The shortcomings of the prior art are overcome and additional advantages are provided through the provision of a circuit design method which includes: automatically estimating lengths of interconnect segments to be employed in interconnecting at least some circuit components of a plurality of placed circuit components of a circuit layout, the automatically estimating including automatically generating pin locations for a plurality of pins to be employed with the at least some circuit components of the circuit layout, wherein the interconnect segments interconnect the plurality of pins, and employing a route estimator to estimate lengths of the interconnect segments based on the generated pin locations of the plurality of pins; and employing the estimated interconnect segment lengths in automatically estimating resistance capacitance interconnect parasitics for the interconnect segments to be employed in the circuit layout.

In certain enhanced aspects, the present invention includes employing interconnect attributes derived from a schematic of the circuit layout in combination with the estimated interconnect segment lengths to automatically estimate the resistance capacitance interconnect parasitics for the interconnect segments to be employed in the layout. The interconnect attributes define electrical and physical properties of at least some of the interconnect segments. The method can further include automatically updating a schematic netlist for the circuit based on the estimated resistance capacitance interconnect parasitics. The interconnect segments can include a plurality of nets to be employed in interconnecting the plurality of pins, wherein each net comprises at least one interconnect segment. Further, the automatically generating pin locations can include for each net, arbitrarily selecting a source pin for the net, and automatically selecting at least one sink pin to be a shortest distance from the source pin. In addition, the circuit layout can include a plurality of interconnect levels, and the method can include prespecifying pin locations for a lower interconnect level of the circuit, and wherein the automatically generating pin locations can comprise automatically generating pin locations for a plurality of pins in at least one other, higher interconnect level of the plurality of interconnect levels.

Systems and computer program products corresponding to the above-summarize methods are also described and claimed herein.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

BEST MODE FOR CARRYING OUT THE INVENTION

Figure 1:
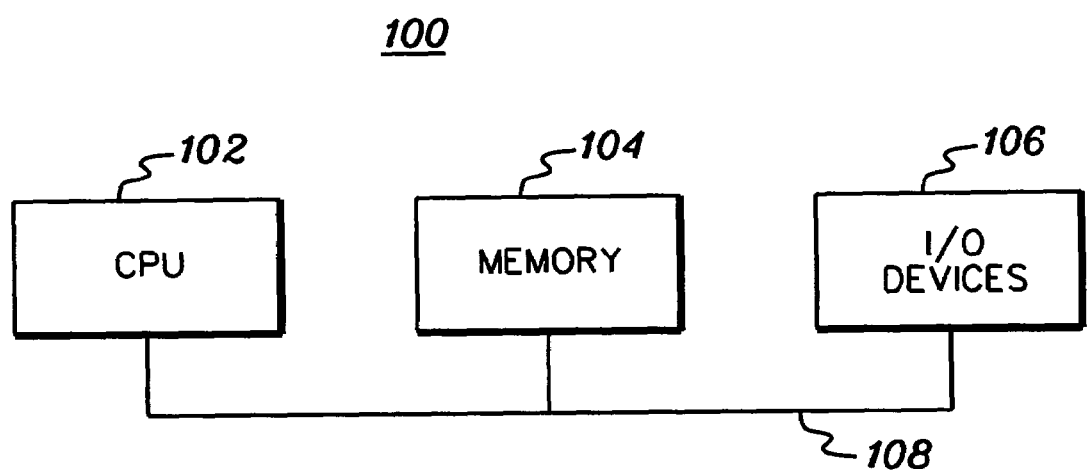
FIG. 1 depicts one example of a computing environment to incorporate and use one or more aspects of the present invention.

As briefly noted, in custom VLSI circuit design, the interconnect parasitic (either wire or via) between circuits in a design is typically manually measured or estimated based on a drawn floorplan of the design. These interconnect parasitic elements are then manually annotated onto the schematic. The schematic with the estimated interconnect parasitics is then analyzed through timing tools for timing and area optimization. The process requires significant manual effort on the part of the designer in measuring and estimating wire lengths between circuits in the design and then annotating the schematic with these parasitic elements. The accuracy and completeness of the estimated interconnect lengths between circuits depends upon the experience of the designer and can vary significantly within a large VLSI design team. Because of the time required, typically only a critical portion of the interconnect lengths are estimated, and thus, the timing of the design will not be known with a high degree of confidence until the circuit layout is completely routed and extracted timing is performed.

Generally stated, provided herein is an automated facility for estimating interconnect parasitics for, for example, custom VLSI circuits based on estimated routes performed on all the nets interconnecting placed circuit components in a circuit layout, in combination with certain net attributes provided with a schematic of the circuit. The estimating of interconnect segment lengths includes automatically generating pin locations for a plurality of pins to be employed in at least one metal level to interconnect at least some circuit components of the circuit layout. A route estimator, such as a Steiner route estimator, is then employed to estimate lengths of interconnect segments based on the generated pin locations of the plurality of pins. The estimated interconnect segment lengths and the net attributes are combined to automatically create estimated resistance capacitance parasitic models for the interconnect segments to be employed in the circuit layout. These resistance capacitance (RC) parasitic models of the interconnect segments, and vias between metal levels, are then stitched with the circuit elements in the circuit schematic for subsequent accurate timing analysis of the circuit design before the circuit design is committed to final routing efforts based on the defined circuit layout.

Before describing various aspects of the present invention in greater detail, the following definitions are provided to facilitate an understanding of the present invention:

Schematic—electrical drawing of a circuit.

Floorplan—a graphical drawing which indicates location, size and form factor of certain objects within a certain level of a VLSI circuit hierarchy. A floorplan is a precursor to a layout.

Default Interconnect—interconnect with electrical and physical properties that maximize the number of wiring tracks in each wiring layer in the chip yet satisfy the RC delay and coupling noise requirements of a large percentage of the connections/nets in the chip for a given VLSI semi-conductor process. They usually have minimum width and minimum spacing and large RC parasitic delay for long or heavily loaded interconnects/nets.

Net Attributes for Default Interconnect—the values of the electrical and physical properties of default interconnect/wiring of a given circuit design.

Non-Default Interconnect—specially selected electrical and/or physical properties of certain interconnect/wiring of a circuit. For example, critical wiring paths may have a larger interconnect width, greater interconnect spacing, a metal level with lower resistivity, and/or more shielding than default interconnects in order to reduce the parasitic RC delay of those interconnects.

Net Attributes for Non-Default Interconnect—the values of the electrical and physical properties for non-default interconnect/wiring of a given circuit design.

Circuit Layout—a graphical drawing which indicates location, size and form factors of objects, and contains connectivity and detailed shapes of the objects and interconnect routes between the objects. The detailed shapes of the objects represent different manufacturing levels of the semiconductor process, i.e., polygate, metal layers for interconnecting objects, P+ diffusion area of a transistor, N+ diffusion area of a transistor, etc. A completely placed, routed and checked circuit layout is used for manufacturing of the VLSI circuit/chip.

Placed Circuit Components—components or objects of the circuit which are placed in the graphical circuit layout drawing and from which the facility of the present invention estimates pin locations, interconnect segment lengths, and resistance capacitance interconnect parasitics.

Netlist—a text description of the connections between pins of two or more components in a VLSI circuit/chip. These pins/components can be from different levels of the VLSI chip hierarchy. Each connection has a unique name associated with it. The netlist includes component instantiations and occasionally the electrical and physical property information of their connections.

Steiner Route Estimator—a facility for estimating length of an interconnect segment employing a Steiner tree/graph/route estimation. Steiner estimation is described in greater detail in various publications, including a publication by Hwang et al. entitled "The Steiner Tree Problem (Annals of Discrete Mathematics, Vol. 53)", published by North-Holland, October 1992, the entirety of which is hereby incorporated herein by reference.

Parsitic RC Model—a resistance capacitance model with specific values, determined in accordance with an aspect of the present invention, by a formula employing at least some of the interconnect segment lengths, interconnect spacings, interconnect widths, metal level of the interconnects and neighbor hostility factors. For example, the formula may be based on the geometry of the interconnect, the interconnects's left, right, top and bottom neighbors' geometry, the interconnects' left and right neighbor switching conditions, material of the interconnect and dielectric material between the metal levels.

VLSI Circuit Hierarchy—a very large scale integrated (VLSI) circuit hierarchy comprises various levels of functional circuit units. As one example, a VLSI circuit may comprise units, with each unit comprising macros. A macro may comprise one or more sub-macros, and a sub-macro one or more gate/cells. A gate/cell may comprise one or more transistors/devices which may be drawn and shown in a layout or schematic. There are input/output pins associated with each level of the hierarchy. Examples of a VLSI circuit include a microprocessor, DRAM, DSP. Examples of units include a floating point unit, and an instruction fetch unit. Examples of macros include a 32-bit parallel adder, and a 32-bit register. Examples of sub-macros include clock drivers, latches, and 4-bit ripple carry adders. Examples of gates/cells are 2 input NAND and 3 input NOR devices, etc.

Referring now to the drawings, one embodiment of a computing environment to incorporate and use one or more aspects of the present invention is depicted in FIG. 1. This computing environment 100 includes, for instance, a central processing unit 102, a memory 104 (e.g., main memory) and one or more input/output (I/O) devices 106 coupled to one another, via, for example, one or more busses 108.

As one example, computing environment 100 may comprise a RISC workstation offered by International Business Machines Corporation running an AIX operating system. However, those skilled in the art will note that the concepts disclosed herein are not restricted to the particular computing environment architecture referenced and may be employed with any computing environment which supports the innovative functions described.

Figure 2:
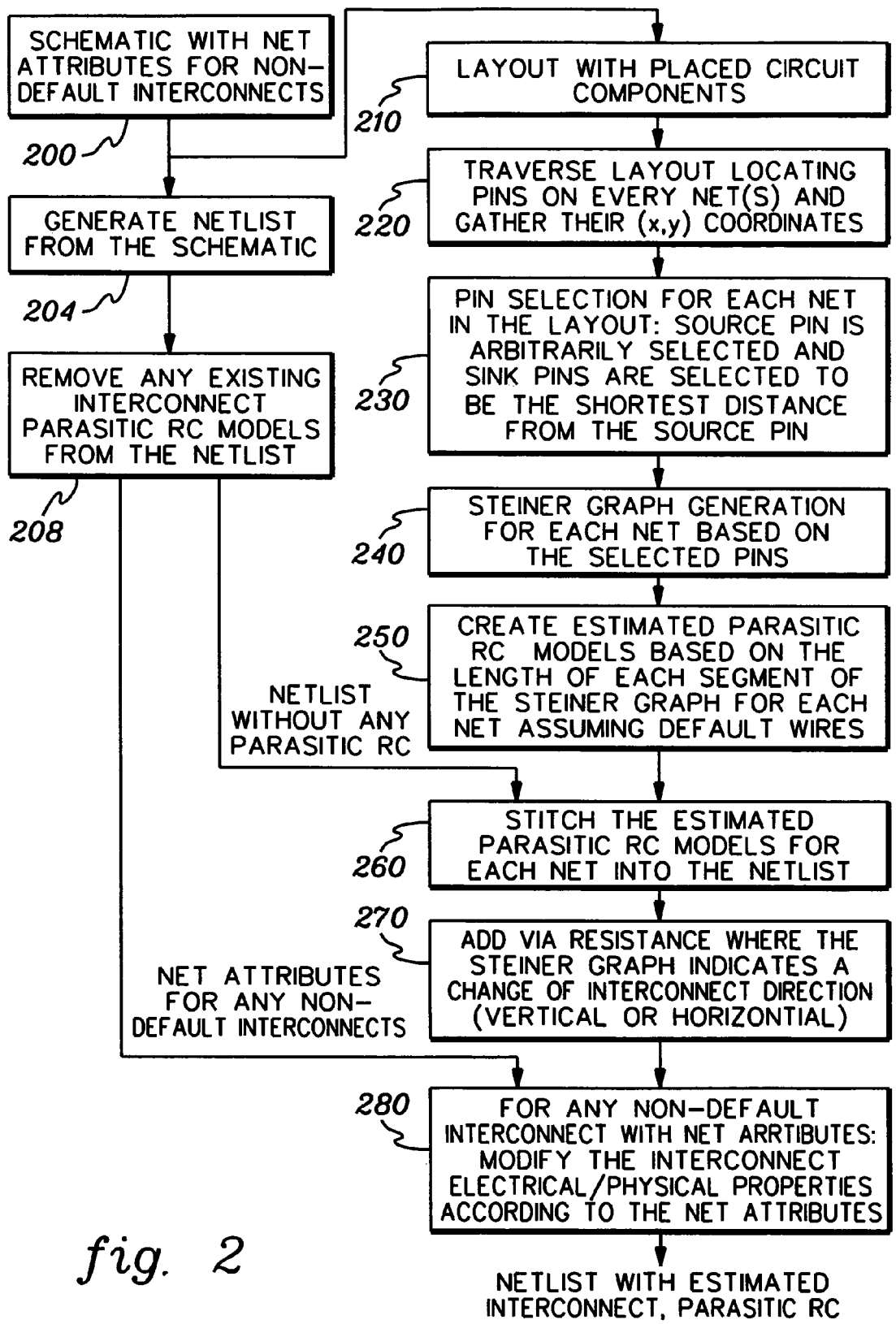
FIG. 2 is flowchart of one embodiment of an automated process for estimating resistance capacitance interconnect parasitics, in accordance with an aspect of the present invention.

FIG. 2 depicts a flowchart of one embodiment of a process or facility for automatically estimating resistance capacitance interconnect parasitics, in accordance with an aspect of the present invention. This process assumes the existence of a circuit schematic which may have net attributes for, in one embodiment, non-default interconnects 200. A circuit layout with placed circuit components is generated in the traditional manner during a conventional circuit design process. As one example, the circuit being designed may comprise a custom VLSI circuit. Generation of a circuit layout is described in the literature. For example, reference the applicable discussion in a textbook by N. Weste and K. Eshraghian entitled: *Principles of CMOS VLSI Design: A System Perspective*, Addison-Wesley Publishing Company (1985), the entirety of which is hereby incorporated herein by reference.

Processing begins by traversing the circuit layout locating a possible location of every pin on every net, and the X, Y coordinates thereof 220. Processing then automatically selects pin locations for each net in the layout 230. By way of example, this can be accomplished by locating a source pin (i.e., output pin) for the net, and then selecting sink pins (i.e., input pins) for each macro to be connected to the net. The sink pin of each macro is selected to be the pin location a shortest distance from the source pin. Any sub-macros within a given macro are assumed to be electrically connected together at a lower hierarchical level than the level currently under analysis. Further, the processing assumes that at a lower or lowest level of the hierarchy, pin locations are specified in the placed circuit layout for interconnecting components, such as sub-macro within a given macro.

By way of further example, for any pins in any sub-macro of a macro comprising components in a placed circuit layout, and connected to the input/output of the macro, the pin locations from the sub-macros are "popped up" as an approximate location of the layout I/Os on the next highest level of hierarchy. If an input signal into a macro fans out to multiple sub-macros, the macro may have multiple possible pin locations defining the one logical pin (i.e., at least one pin for each sub-macro). By automatically selecting the pin location closest to the drive (or source) pin in the next level of metal hierarchy, the process presented herein ensures that minimal redundant interconnects are presented. If a net has multiple drivers (i.e., a large driver split into multiple gates), then it will have multiple sources. Multiple sources create ambiguity when selecting one sink pin from many sink pins on a sub macro. In such a case, the center of mass for all the source and sink pins on the net can be calculated, and pin location is selected by shortest distance to this center. This approach means that the pin selection may vary between instantiations of the same instance.

The generated pin locations of each net are then employed in a route estimator, such as a Steiner route estimator, to form a graph with point locations for a Steiner tree for each net based on the selected pins 240. The graph of the Steiner plot contains a list of coordinate pairs that describe wire segments in the Steiner tree. To map coordinates to instance terminals in a layout, an instance and pin name hash table is kept using the pin coordinates as a key. Each coordinate in the Steiner graph is checked in the hash table. If the coordinate does not correspond to a pin, it is a junction point. Junction points are recorded so that other wire segments may connect to them as described by the Steiner plot. The orientation of the wire segment in the Steiner plot is recorded so that a via is added on a junction where two segments of orthogonal direction intersect. This via reflects the change in metal layer required to switch metal directions between vertical and horizontal. When a wire RC parasitic model is created to represent a segment, it is connected to the two nets defined by their end coordinates, whether they be pin or junction points. Unique net names are built for these nets by concatenating the coordinates, type of junction, orientation, and original net name. The final netlist with Steiner estimated parasitics contains the wire RC models reflecting the Steiner segments, sub-macro blocks, and nets connecting the wire models and sub-macro blocks together.

The process next creates parasitic RC models for each interconnect segment based on the length of each segment in the Steiner graph for each net, and assuming default interconnects 250 unless otherwise defined by net attributes. Default interconnects are assumed since the delay and coupling noise requirements for a large percentage of the nets in the chip can be met with default interconnects. The net attributes in the schematic define, for example, metal level, interconnect width, interconnect spacing and neighbor hostility for a small number of nets, such as clock and timing critical nets that need non-default wires with small RC parasitic delay. The default wires in the circuit design are assumed to be a minimum width and minimum spacing for a given technology, and therefore have a higher RC parasitic delay for longer interconnects.

As shown in FIG. 2, the process also includes generating a netlist from the schematic 204, which can be readily accomplished by one skilled in the art using existing products, i.e., the SNL netlister by International Business Machines Corporation. Any parasitic interconnect RC elements or models within the generated netlist are then removed 208. This allows the new parasitic interconnect RC models based on the Steiner estimated segment lengths to be stitched into the netlist 260. Further, when the route estimator indicates a change in the direction/wiring level in a net, a resistor via model is to be automatically inserted between the interconnect segments or interconnect RC parasitic models 270.

For any non-default interconnect with net attributes from the schematic, processing next modifies the electrical/physical properties of the corresponding estimated interconnect according to these non-default net attributes 280. For example, metal level, interconnect width and spacing may be modified according to the net attributes from the schematic for all non-default interconnects. All nets in the circuit layout with placed circuit components may be automatically estimated using the process of FIG. 2 to create a complete interconnect/via parasitic model of the circuit design. An output of the process can be an updated netlist with the estimated interconnects and the corresponding estimated parasitic RC models. This netlist is hierarchical in nature, wherein each netlist file reflects, in one example, one schematic macro view. The device/circuit connections and instantiations can finally be assembled according to the schematic with the updated netlist using the circuit layout.

By way of further example, FIGS. 3–9 depict examples of various aspects of the processing of FIG. 2.

Figure 3:
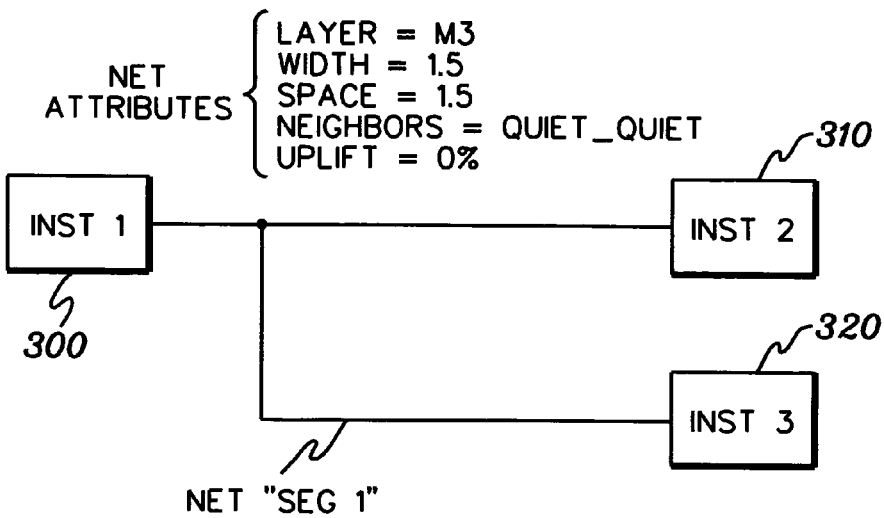
FIG. 3 depicts one embodiment of a net schematic showing net attributes for non-default interconnect, in accordance with an aspect of the present invention.

FIG. 3 depicts one embodiment of a net schematic with three instances 300, 310, 320 of macros which are interconnected via a net labeled "SEG 1". This net is assumed to comprise non-default interconnect which has electrical and physical properties (i.e., net attributes) defined as layer M3 (metal level 3), width 1.5 (e.g., microns), spacing between interconnect lines 1.5 (e.g., microns), quiet neighbors and a zero percent uplift. Those skilled in the art will understand that these particular net attributes are provided by way of example only and are typical non-default interconnect for today's VLSI circuits.

Figure 4:
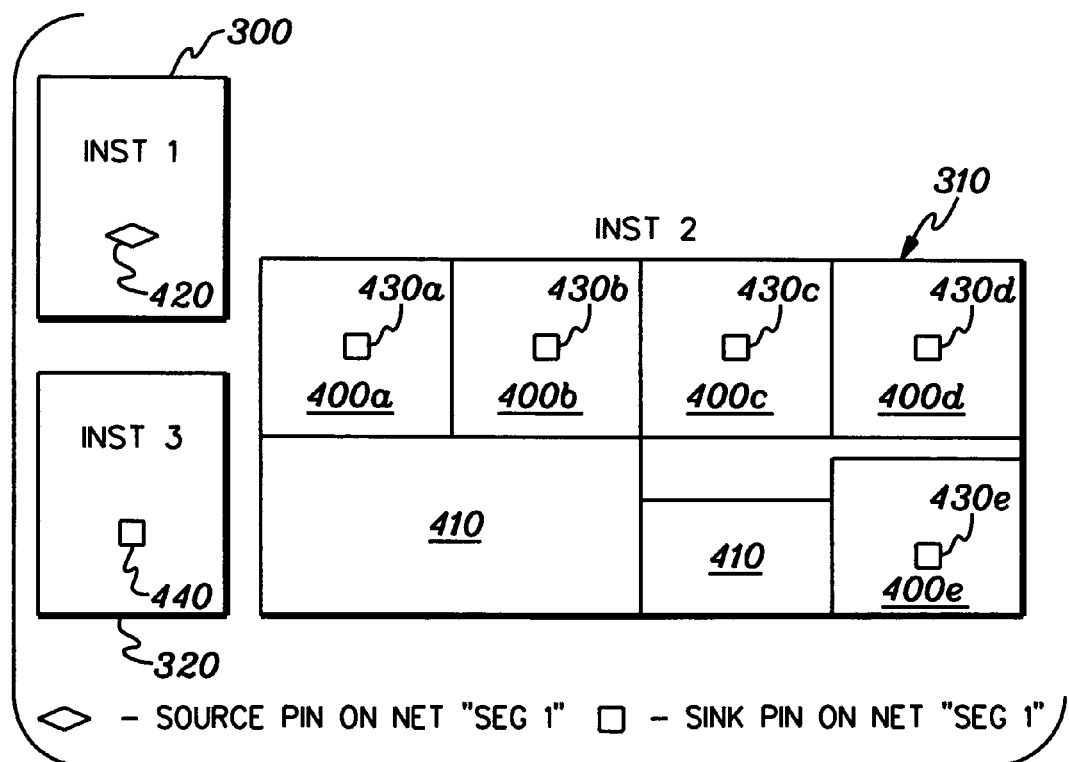
FIG. 4 depicts one example of a circuit layout showing three simplified instances of functional macros and pin locations for each macro and sub-macro to be electrically interconnected via the net, in accordance with an aspect of the present invention.

FIG. 4 depicts one example of a circuit layout showing the three instances 300, 310 & 320 of macros. These instances are assumed to comprise placed components in the circuit layout. In this example, instance 1 300 and instance 3 320 are each assumed to comprise a single macro, while instance 2 310 comprises a plurality of sub-macros 400a, 400b, 400c, 400d, 400e, 410, of which only sub-macros 400a–400e are to be electrically connected with instance 1 300 and instance 3 320 via net "SEG 1". As shown, instance 1 300 is assumed to have one output or source pin 420 which connects to net "SEG 1". The five sub-macros 400a–400e of instance 2 310 each have one input pin 430a–430e to be electrically connected to net "SEG 1". Instance 3 is assumed to have one input pin 440 which is to connect to net "SEG 1". The netlist provided with the schematic defines a given pin as either in input pin or an output pin (i.e., either sink or source).

In accordance with the process of FIG. 2, the layout of FIG. 4 is traversed and every possible pin location is identified for net "SEG 1", and X, Y coordinates (e.g., absolute values) are gathered for these pin locations. To facilitate this process, one of ordinary skill in the art can provide an automated facility to traverse the layout and gather these coordinates. Again, in the example of FIG. 4, there is one source pin from instance 1 300 for net "SEG 1", and six sink pins for the net, i.e., five sink pins 430a–430e from instance 2 310, and one sink pin 440 from instance 3 320.

Figures 5, 6:
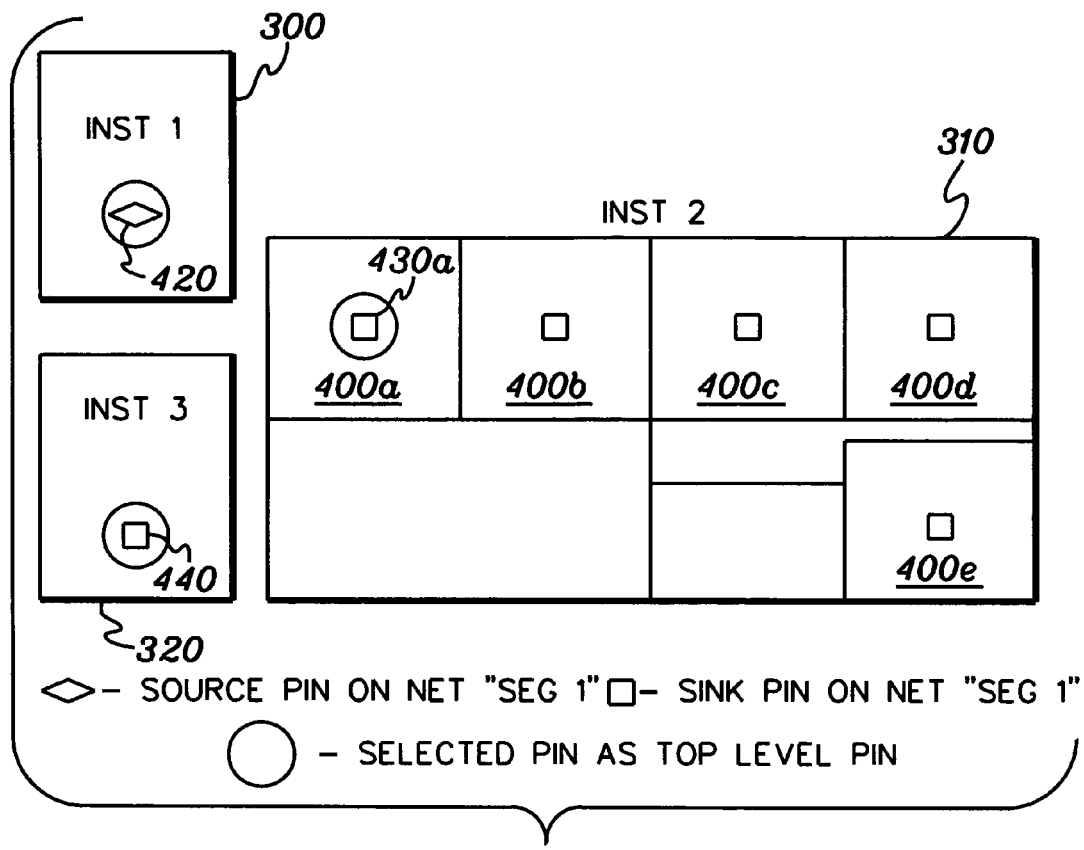
FIG. 5 depicts the circuit layout of FIG. 4, showing automatically selected source and sink pin locations for the net, in accordance with an aspect of the present invention.
FIG. 6 depicts one example of Steiner graph parameters for the net to interconnect the functional macros of FIG. 5, in accordance with an aspect of the present invention.

Referring to FIG. 5, after identifying the source and sink pins and their location, the process of FIG. 2 next selects one input/output pin per instance 300, 310 and 320 to be connected in the net. The source pin 420 is arbitrarily selected, and the sink pins are then selected according to their distance from the source pin. As one example, for each instance 310, 320, the pin location closest to source pin 420 is to be automatically selected, which in this example, results in the selection of sink pin 430a of sub-macro 400a of instance 310, and pin 440 of instance 320. By selecting the sink pin location closest to the source, RC parasitic delays are minimized, thus enhancing timing. In accordance with an aspect of the present invention, the process of FIGS. 3–5 is repeated automatically for each net to be employed in the circuit layout.

Figure 7:
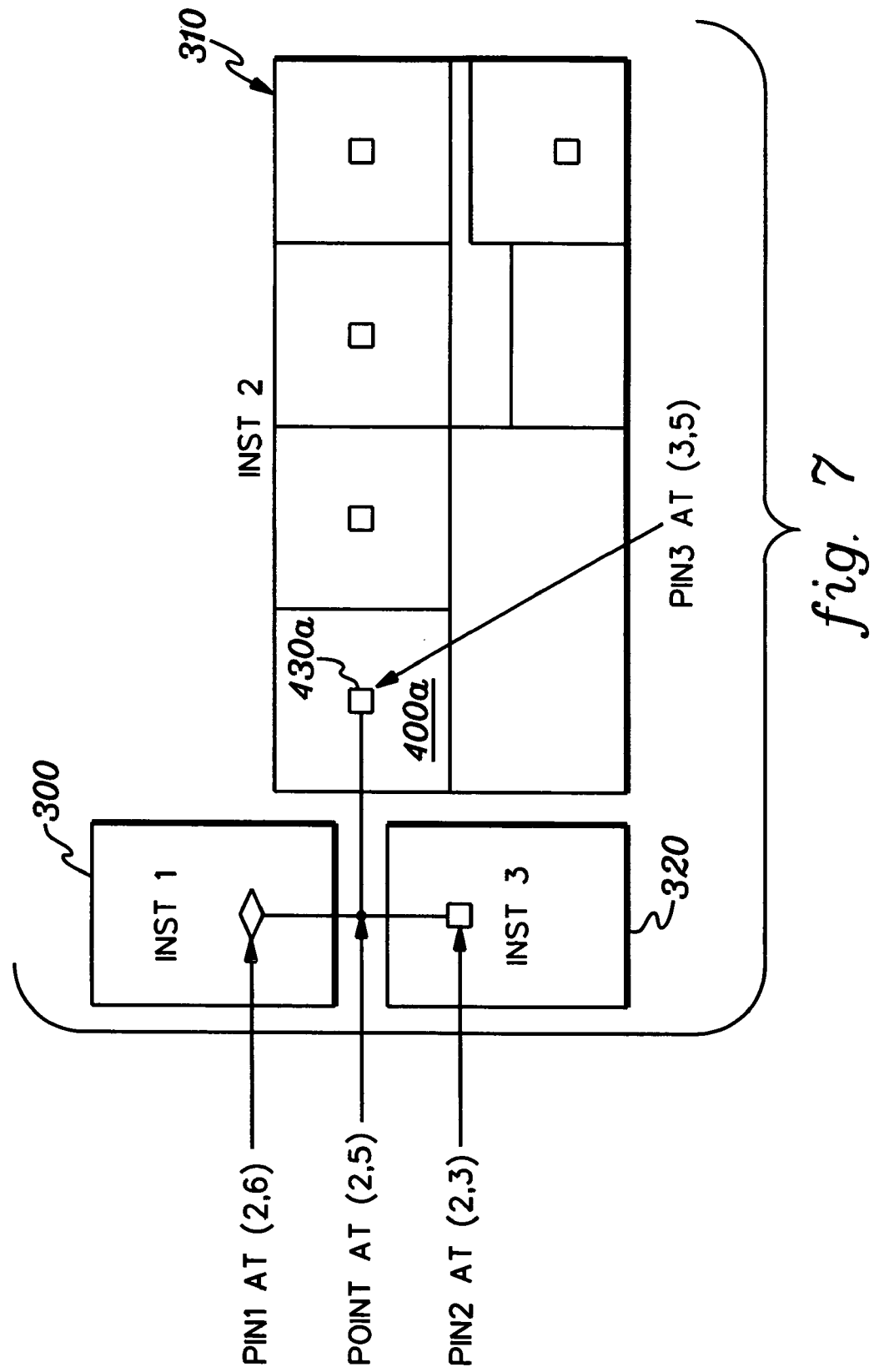
FIG. 7 depicts the circuit layout of FIG. 5, showing a Steiner route graph for the net given the circuit layout of FIGS. 4 & 5, in accordance with an aspect of the present invention.

FIG. 6 depicts one example of creation of a Steiner graph employing the selected pins for net "SEG 1" of FIG. 5. The Steiner graph is generated for each net based on the selected pins. In the example of FIG. 6, the three pins 420, 430a and 440 are assumed to be graphed to X, Y coordinates (2, 6), (3, 5) and (2, 3), respectively (see FIG. 7). The Steiner graph connects pins 420, 430a and 440 with interconnecting segments as listed in FIG. 6, and as shown in FIG. 7. At point (2, 5) the two interconnecting segments meet.

Figure 8:
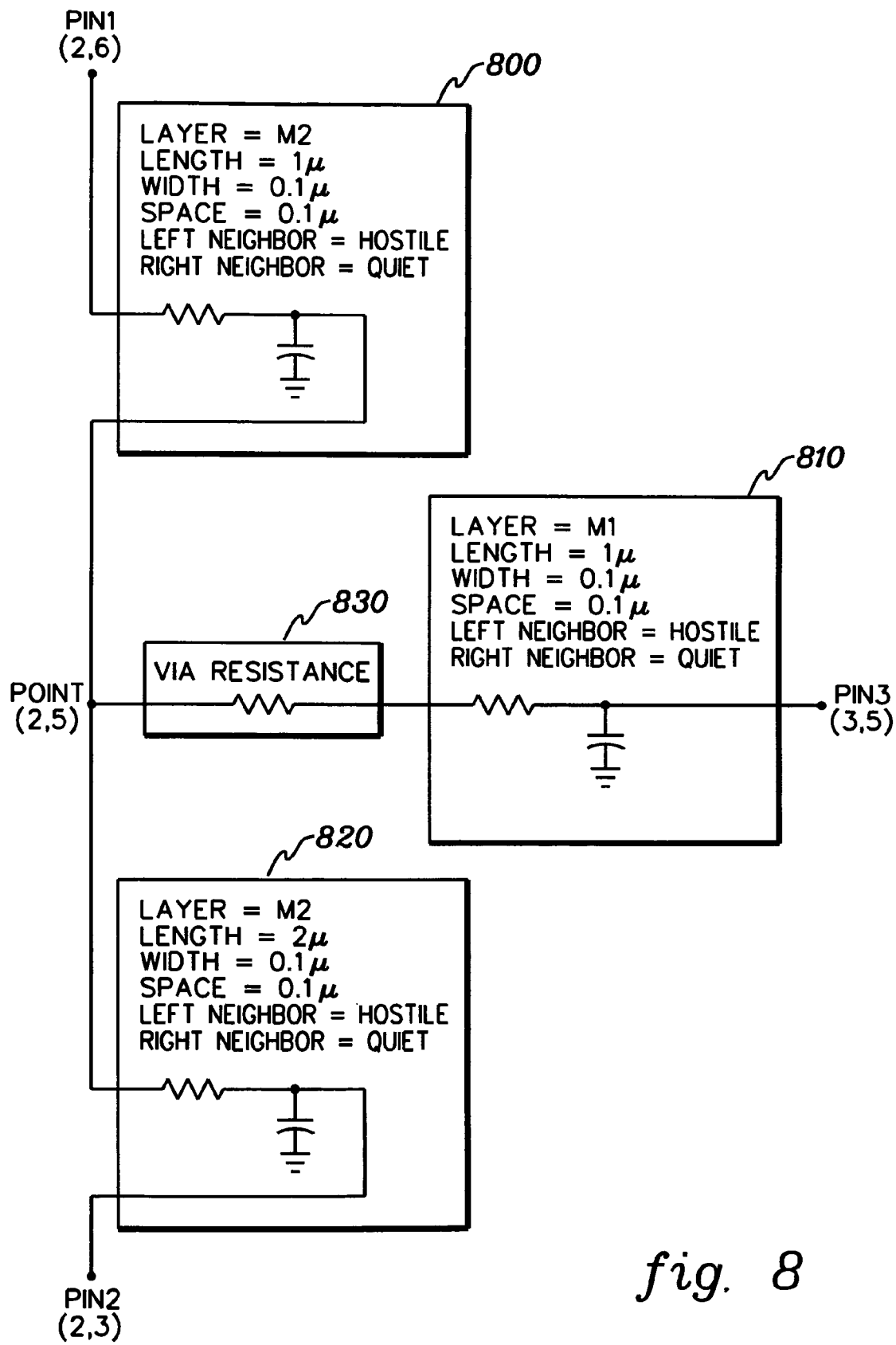
FIG. 8 is an estimated parasitic RC model for the net of FIG. 7 showing net attributes specifying default interconnects, in accordance with an aspect of the present invention.

Based on the length of each segment in the Steiner graph, parasitic RC models are estimated for each net assuming default wires. By way of example, FIG. 8 depicts net "SEG 1" with parasitic RC models 800, 810, 820 inserted. RC parasitic model 800 models the vertical wire segment between coordinates (2, 5) and (2, 6), while model 820 represents the vertical wire segment between coordinates (2, 5) and (2, 3). Model 810 is an estimated parasitic RC model for the horizontal wire segments between coordinates (2, 5) and (3, 5). The net attributes for each interconnect segment are also specified. Actual RC values can be readily determined by one skilled in the art employing the Steiner graph and the net attributes. As a further aspect, the processing of FIG. 2 automatically generates and inserts a via resister 830 for modeling the wiring level change between the vertical interconnect segment and the horizontal segment in different wiring layers. The resistive value of the via depends on the physical geometry of the via and electrical properties of the metal layers used in the semiconductor process. The value of this resistor can also be readily determined by one skilled in the art. Usually the VLSI semiconductor process electrical parameters of the different metal layers and vias are stored ahead of time.

Figure 9:
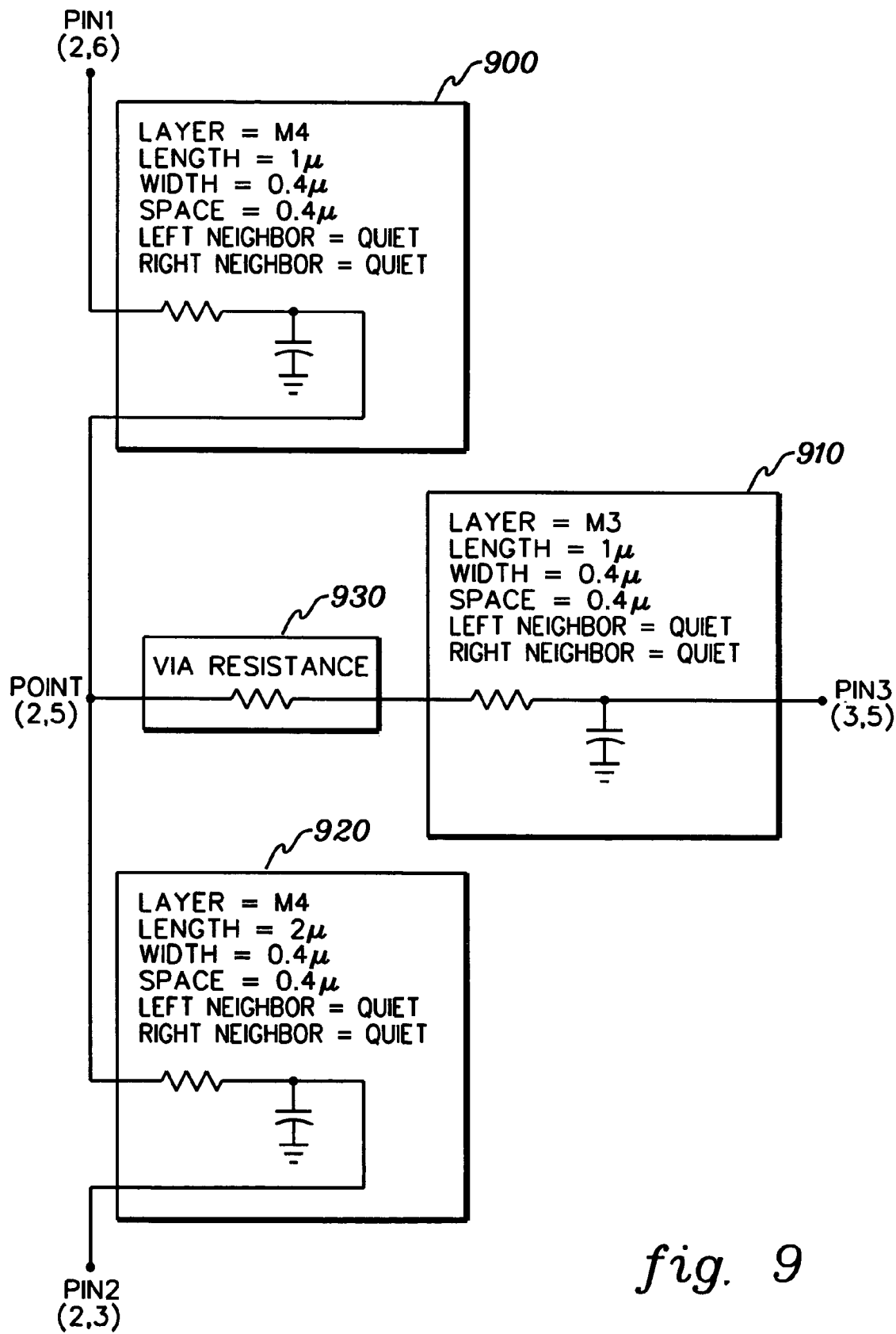
FIG. 9 is an estimated parasitic RC model for the net of FIG. 7 showing net attributes specifying non-default interconnects, in accordance with an aspect of the present invention.

As noted, FIG. 8 assumes that default interconnects having the net attributes specified are provided. In FIG. 9, net attributes for non-default interconnects are substituted in the models 900, 910, 920, 930 for the default interconnects of FIG. 8. Actual net attributes for default interconnect and non-default interconnect are dependent upon the particular technology employed. In the example of FIG. 8, the default interconnect is assumed to be 0.1 microns wide, have 0.1 microns spacing, and either reside at metal level 1 or metal level 2. Neighbor wires are either quiet or hostile, and no uplift is assumed on the wire segment length. The properties of the non-default interconnect defined in the models of FIG. 9 include 0.4 micron width interconnects with 0.4 micron spacing between interconnects. Metal level is assumed to comprise metal level 3, metal level 4, metal level 5, etc., and neighbors are assumed to be either both quiet or both hostile. An uplift of X % increase or reduction on the wire segment length may be provided to account for longer or shorter lengths than the Steiner estimated lengths.

By way of example, five percent of wires in a given VLSI circuit layout may comprise critical interconnects from a timing standpoint. These critical interconnects have a significant impact on the total timing function of the circuit, and as such, may be provided with non-default interconnects selected to minimize the parasitic RC delay.

Figure 10:
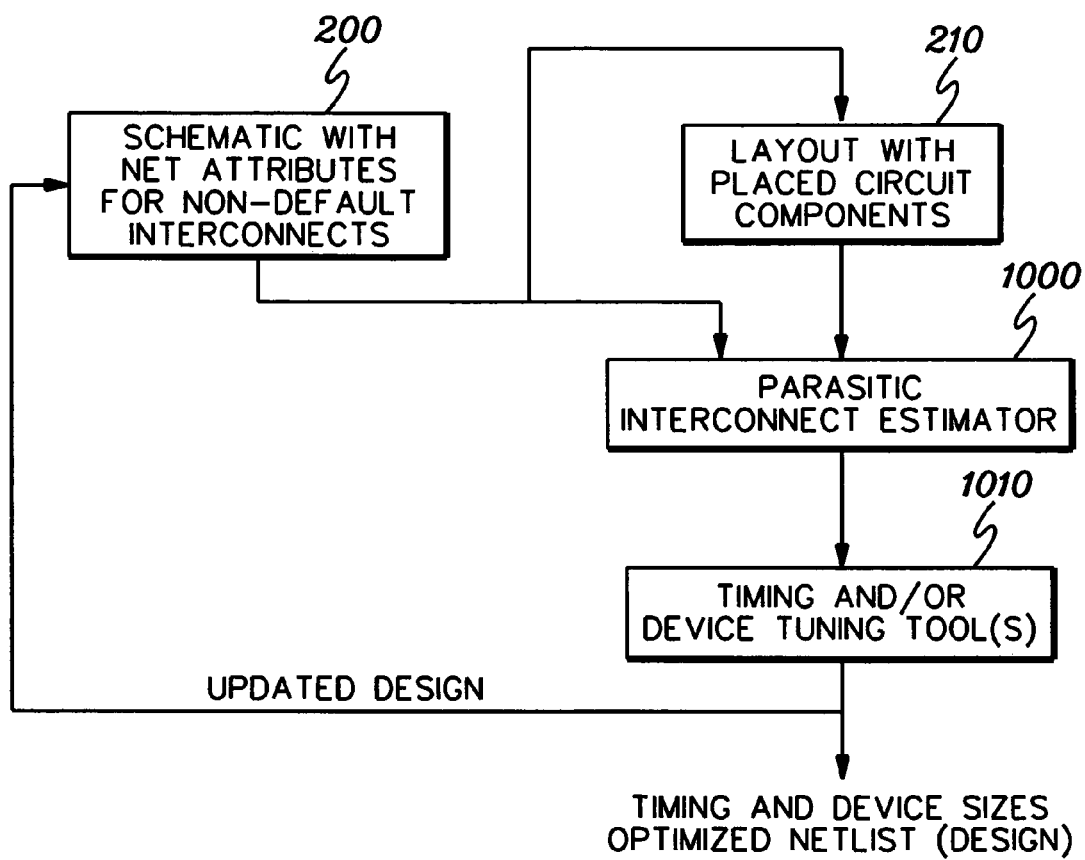
FIG. 10 is a flowchart of one circuit design process employing an automated parasitic interconnect estimation process, in accordance with an aspect of the present invention.

FIG. 10 is one process example of how the automated parasitic interconnect estimation process described in FIG. 2 and depicted in the examples of FIGS. 3–9 could be employed in a circuit design process. As shown, the schematic with the net attributes for non-default interconnects 200 and the circuit layout with the placed circuit components 210 are again inputs to the automated parasitic interconnect estimation process 1000, which comprises a facility such as depicted in FIG. 2. The netlist with the estimated interconnect and parasitic RC models is output from the estimation process 1000, and forwarded to a timing and/or tuning tool 1010 to evaluate and/or update the circuit design. By way of example, timing tools such as the EinsTimer and EinsTLT tools, offered by International Business Machines Corporation of Armonk, N.Y., and/or a tuning device/size optimization tool such as the EinsTuner tool, offered by International Business Machines Corporation, could employ the updated netlist with estimated interconnect and parasitic RC models output from the parasitic interconnects estimation process to automatically provide timing and device sizes optimized to the netlist. This updated circuit design would then be employed to update the schematic with the net attributes 200, thereby facilitating completion of the circuit design process.

Those skilled in the art will note from the above discussion that there are numerous advantages to the estimation facility disclosed herein. For example, the facility presented removes the time consuming effort from the designer of manually annotating wire/parasitic elements into the schematic for modeling of a circuit design, and removes any dependency on a designer's experience to achieve an accurate estimation of wire parasitics from a circuit floorplan. Further, the automated estimation process disclosed herein provides a wire parasitic estimation on 100% of the nets in a circuit design, instead of only selected nets (when performed manually). All nets, both long and short, are processed, thereby exposing any late timing paths in the design.

The process disclosed produces an accurate timing model, for both late and early modes, of a circuit design during the early schematic/placement phase instead of after a post-layout extraction, as is typical with the traditional method. The time lapse between layout with placed circuit to timing model created with parasitics generated employing this process estimation can be as short as thirty minutes for a small VLSI design, to a few hours for a very large design. The traditional time lapse from placed circuits, through routing, checking and extraction to creating extracted timing models, is typically a week for a small VLSI design, and two months or more for a larger design. Thus, the invention enables a proper trade-off between different design timing options earlier in the design cycle, which leads to early completion of the circuit design.

In addition, the methods presented herein avoid the time consuming re-work necessary with traditional approaches should a timing surprise occur after post-design extracted timing because of an incomplete or an inaccurate manual wire parasitic estimation. The processing method disclosed enables accurate timing analysis of a wire parasitic effect on different placements of the same circuit design without requiring actual time and effort in rerouting the different layouts. Designers may rapidly prototype placement topologies in this manner.

The estimation process disclosed herein further reduces the chance of oversized or undersized device widths due to an inaccurate estimation of parasitic loads in the design. Net attributes are employed in the estimation process and are stored centrally in the schematic to define metal level, interconnect width and interconnect spacing for specifying electrical characteristics of the RC parasitic. Further, the estimation process disclosed only employs a circuit layout with placed circuit components and net attributes for non-default interconnects in the schematic as inputs. All pin locations may be algorithmically generated without user intervention. Multiple pin locations may be considered for each I/O pin in a macro view where there are multiple sinks within the circuit, thus removing the need for designers to manually engineer pin locations during the early design phase.

The capabilities of one or more aspects of the present invention can be implemented in software, firmware, hardware or some combination thereof.

One or more aspects of the present invention can be included in an article of manufacture (e.g., one or more computer program products) having, for instance, computer usable media. The media has therein, for instance, computer readable program code means or logic (e.g., instructions, code, commands, etc.) to provide and facilitate the capabilities of the present invention. The article of manufacture can be included as a part of a computer system or sold separately.

Additionally, at least one program storage device readable by a machine embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A circuit design method comprising:
  automatically estimating interconnect segments to be employed in interconnecting at least some circuit components of a plurality of placed circuit components of a circuit layout, the automatically estimating interconnect segments including automatically generating pin locations for a plurality of pins to be employed with the at least some circuit components of the circuit layout, the interconnect segments to interconnect the plurality of pins, and employing a route estimator to estimate lengths of the interconnect segments based on the generated pin locations of the plurality of pins without laying out the interconnect segments therebetween; and employing the estimated interconnect segment lengths and interconnect attributes derived from a schematic of the circuit in automatically estimating resistance capacitance interconnect parasitics for the interconnect segments to be employed in the circuit layout without layout the interconnect segments therebetween, wherein the interconnect attributes define certain electrical and physical properties of at least some of the interconnect segments to be employed.

2. The method of claim 1, further comprising automatically updating a schematic netlist for the circuit based on the estimated resistance capacitance interconnect parasitics.

3. The method of claim 2, wherein the automatically updating of the schematic netlist includes accounting for different interconnect attributes between default interconnect segments and non-default interconnect segments.

4. The method of claim 2, wherein the automatically updating includes adding a via resistance to the schematic where the route estimator indicates a change in interconnect direction.

5. The method of claim 1, wherein the interconnect segments are part of a plurality of nets to be employed in interconnecting the plurality of pins, and wherein each net comprises at least one interconnect segment of the interconnect segments.

6. The method of claim 5, wherein the plurality of nets comprises substantially all nets needed to electrically interconnect the placed circuit components of the circuit layout.

7. The method of claim 5, wherein the automatically generating pin locations comprises for each net, locating a source pin for the net, and automatically selecting at least one sink pin to be a shortest distance from the source pin.

8. The method of claim 1, wherein the circuit layout includes a layout level hierarchy and a plurality of interconnect levels, and wherein the method further comprises prespecifying pin locations for a lowest level of the circuit layout, and wherein the automatically generating pin locations automatically generates pin locations for a plurality of pins in at least one other, higher interconnect level of the plurality of interconnect levels and at least one other layout level of the layout hierarchy.

9. The method of claim 1, wherein the automatically estimating resistance capacitance interconnect parasitics for the interconnect segments comprises employing a formula to automatically estimate a resistance capacitance parasitic value for each interconnect segment, the formula employing for the interconnect segment estimated interconnect length, interconnect spacing, interconnect width, metal level of the interconnect and a neighbor hostility factor.

10. A circuit design system comprising:
means for automatically estimating interconnect segments to be employed in interconnecting at least some circuit components of a plurality of placed circuit components of a circuit layout, the means for automatically estimating interconnect segments including means for automatically generating pin locations for a plurality of pins to be employed with the at least some circuit components of the circuit layout, the interconnect segments to interconnect the plurality of pins, and means for employing a route estimator to estimate lengths of the interconnect segments based on the generated pin locations of the plurality of pins without routing the interconnect segments therebetween; and
means for employing the estimated interconnect segments lengths of interconnect attributes derived from a schematic of the circuit to automatically estimate resistance capacitance interconnect parasitics for the interconnect segments to be employed in the circuit layout, without laying out the interconnect segments, wherein the interconnect attributes define certain electrical and physical properties of at least some of the interconnect segments to be employed.

11. The system of claim 10, further comprising means for automatically updating a schematic netlist for the circuit based on the estimated resistance capacitance interconnect parasitics.

12. The system of claim 11, wherein the means for automatically updating of the schematic netlist includes means for accounting for different interconnect attributes between default interconnect segments and non-default interconnect segments.

13. The system of claim 11, wherein the means for automatically updating includes means for adding a via resistance to the schematic where the route estimator indicates a change in interconnect direction.

14. The system of claim 10, wherein the interconnect segments are part of a plurality of nets to be employed in interconnecting the plurality of pins, and wherein each net comprises at least one interconnect segment of the interconnect segments.

15. The system of claim 14, wherein the plurality of nets comprises substantially all nets needed to electrically interconnect the placed circuit components of the circuit layout.

16. The system of claim 14, wherein the means for automatically generating pin locations comprises for each net, means for locating a source pin for the net, and for automatically selecting at least one sink pin to be a shortest distance from the source pin.

17. The system of claim 10, wherein the circuit layout includes a layout level hierarchy and a plurality of interconnect levels, and wherein the system further comprises means for prespecifying pin locations for a lowest level of the circuit layout, and wherein the means for automatically generating pin locations automatically generates pin locations for a plurality of pins in at least one other, higher interconnect level of the plurality of interconnect levels and at least one other layout level of the layout hierarchy.

18. The system of claim 10, wherein the means for automatically estimating resistance capacitance interconnect parasitics for the interconnect segments comprises means for employing a formula to automatically estimate a resistance capacitance parasitic value for each interconnect segment, the formula employing for the interconnect segment estimated interconnect length, interconnect spacing, interconnect width, metal level of the interconnect and a neighbor hostility factor.

19. At least one program storage device readable by a machine embodying at least one program of instructions executable by the machine to perform a circuit design method, the method comprising:
automatically estimating interconnect segments to be employed in interconnecting at least some circuit components of a plurality of placed circuit components of a circuit layout, the automatically estimating interconnect segments including automatically generating pin locations for a plurality of pins to be employed with the at least some circuit components of the circuit layout, the interconnect segments to interconnect the plurality of pins, and employing a route estimator to estimate lengths of the interconnect segments based on the generated pin locations of the plurality of pins without layout out the interconnect segments therebetween; and employing the estimated interconnect segment lengths and interconnect attributes derived from a schematic of the circuit in automatically estimating resistance capacitance interconnect parasitics for the interconnect segments to be employed in the circuit layout without laying out the interconnect segments, wherein the interconnect attributes define certain electrical and physical properties of at least some of the interconnect segments to be employed.

20. The at least one program storage device of claim 19, wherein the interconnect segments are part of a plurality of nets to be employed in interconnecting the plurality of pins, and wherein each net comprises at least one interconnect segment of the interconnect segments, and wherein the automatically generating pin locations comprises for each net, arbitrarily selecting a source pin for the net, and automatically selecting at least one sink pin to be a shortest distance from the source pin.

21. The at least one program storage device of claim 19, wherein the circuit layout includes a layout level hierarchy and a plurality of interconnect levels, and wherein the method further comprises prespecifying pin locations for a lower interconnect level of the circuit, and wherein the automatically generating pin locations automatically generates pin locations for a plurality of pins in at least one other, higher interconnect level of the plurality of interconnect levels and at least one other layout level of the layout hierarchy.

22. The at least one program storage device of claim 19, wherein the automatically estimating resistance capacitance interconnect parasitics for the interconnect segments comprises employing a formula to automatically estimate a resistance capacitance parasitic value for each interconnect segment, the formula employing for the interconnect segment estimated interconnect length, interconnect spacing, interconnect width, metal level of the interconnect and a neighbor hostility factor.

* * * * *